US009676927B2

(12) United States Patent
Musick et al.

(10) Patent No.: US 9,676,927 B2
(45) Date of Patent: Jun. 13, 2017

(54) CORE-SHELL COMPOSITE INORGANIC METAL OXIDES AND METHOD OF PREPARING FOR PREVENTION OF THERMAL OXIDATIVE DEGRADATION IN POLYMER AND RESIN COMPOSITIONS

(71) Applicants: The Shepherd Color Company, Cincinnati, OH (US); LPKF Laser & Electronics AG, Garbsen (DE)

(72) Inventors: Michael D. Musick, Mason, OH (US); David Ziemnik, Waynesville, OH (US); James P. White, Hamilton, OH (US); Robin Alexander Krüger, Hanover (DE); Bernd Rösener, Porta Westfalica (DE); Malte Sebastian Fengler, Hanover (DE)

(73) Assignees: The Shepherd Color Company, Cincinnati, OH (US); LPKF Laser & Electronics AG, Garbsen (DE)

( * ) Notice: Subject to any disclaimer, the term of this patent is extended or adjusted under 35 U.S.C. 154(b) by 0 days.

(21) Appl. No.: 14/665,260

(22) Filed: Mar. 23, 2015

(65) Prior Publication Data
US 2015/0291778 A1 Oct. 15, 2015

Related U.S. Application Data

(60) Provisional application No. 61/977,248, filed on Apr. 9, 2014.

(51) Int. Cl.
| C08K 9/10 | (2006.01) |
| C08L 69/00 | (2006.01) |
| C08L 55/02 | (2006.01) |
| C09C 3/06 | (2006.01) |
| H05K 3/18 | (2006.01) |

(52) U.S. Cl.
CPC ............... C08K 9/10 (2013.01); C08L 55/02 (2013.01); C08L 69/00 (2013.01); C09C 3/063 (2013.01); C01P 2002/70 (2013.01); C01P 2004/04 (2013.01); C01P 2004/61 (2013.01); C01P 2004/62 (2013.01); C01P 2004/84 (2013.01); H05K 3/185 (2013.01); H05K 2201/0236 (2013.01); H05K 2203/107 (2013.01)

(58) Field of Classification Search
CPC ....................................... C08K 9/10
USPC ........................................ 524/407
See application file for complete search history.

(56) References Cited

U.S. PATENT DOCUMENTS

| 4,707,722 | A | 11/1987 | Folk et al. |
| 4,753,863 | A | 6/1988 | Spanjer |
| 4,861,620 | A | 8/1989 | Azuma et al. |
| 7,060,421 | B2 | 6/2006 | Naundorf et al. |
| 7,083,848 | B2 | 8/2006 | Kliesch et al. |
| 7,202,288 | B2* | 4/2007 | Kniess ............... B41M 5/267 428/403 |
| 2006/0216513 | A1* | 9/2006 | Musick ............ B82Y 30/00 428/404 |
| 2008/0299357 | A1* | 12/2008 | Nakagawa ............ B32B 5/18 428/201 |
| 2009/0292051 | A1* | 11/2009 | Li ........................ C08K 3/0008 524/404 |
| 2011/0251326 | A1 | 10/2011 | Van Hartingsveldt et al. |

FOREIGN PATENT DOCUMENTS

| DE | 44 15 802 A1 | 11/1995 |
| EP | 1 418 204 A2 | 5/2004 |
| JP | 2010 150353 A | 7/2010 |
| WO | WO 2014/180550 A1 | 11/2014 |

(Continued)

OTHER PUBLICATIONS

International Search Report and Written Opinion dated Jul. 15, 2015 for Application No. PCT/US2015/024809.
Color Pigments Manufacturers Association, Inc., "Classification and Chemical Descriptions of the Complex Inorganic Colored Pigments", 4$^{th}$ Ed., Arlington, VA, Jan. 2013.
Dry Color Manufacturer's Association (DCMA), nka CPMA, "Classification and Chemical Description of the Complex Inorganic Colored Pigments", 3$^{rd}$ Ed., Arlington, VA, 1991, pp. 9-35, 21pgs.
Gupta, M.C., et al., "Role of metal oxides in the thermal degradation of bisphenol a polycarbonate", Journal of Thermal Analysis and Calorimetry, vol. 46, issue 6, 1996, pp. 1671-1679, Abstract only, 1 pg.
Gupta, M.C., et al., "Role of Metal Oxides in the Thermal Degradation of Poly(vinyl chloride)", Ind. Eng. Chem. Res., Jun. 1998, vol. 37, issue 7, pp. 2702-2712, Abstract only, 2 pgs.

(Continued)

Primary Examiner — Doris Lee
(74) Attorney, Agent, or Firm — Frost Brown Todd LLC

(57) ABSTRACT

This invention relates to products of aqueous and other chemical synthetic routes for encapsulation of a core material with an inorganic shell and finished compositions of a core-shell particulate material for application in thermoplastic, thermoset, and coatings resins prior to compounding or application or subsequent thermal processing steps. Disclosed is a composition of particles containing a shell of inorganic oxides or mixed-metal inorganic oxides and a core material of complex inorganic colored pigment, laser direct structuring additives, laser marking, or other beneficial metal oxides, metal compounds, or mixed-metal oxide materials, wherein the shell material is comprised of any single oxide or combination of oxides is taught. Preferred elements of composition for the shell are oxides and silicates of B, Ni, Zn, Al, Zr, Si, Sn, Bi, W, Mo, Cr, Mg, Mn, Ce, Ti, and Ba (or mixtures thereof). Applications may include, but are not limited to, coatings or plastic articles or materials for molded interconnect devices, durable goods, housings, assemblies, devices, and articles that are to be exposed to additional thermal processing. The resulting core-shell materials function in plastic and coatings formulations by minimizing or eliminating detrimental interactions with the resins and metal containing additives resulting in loss of mechanical properties.

10 Claims, 1 Drawing Sheet

(56) References Cited

FOREIGN PATENT DOCUMENTS

WO    WO 2014/187646 A1    11/2014

OTHER PUBLICATIONS

Jellinek, H.H.G., et al., "Thermal oxidative degradation of isotactic polypropylene catalyzed by copper and copper oxide interfaces", J. Pol. Sci., Poly. Chem. Ed., vol. 17, issue 5, pp. 1493-155, May 1979, Abstract only, 3 pgs.

Terakado, et al., "Thermal degradation study of tetabromobisphenol A under the presence metal oxide: Comparison of bromine fixation ability", J. Anal. App. Pyrolysis vol. 91, issue 2, Jul. 2011, pp. 303-309, Abstract only, 1 pg.

\* cited by examiner

Example 17
Example 18
Example 21
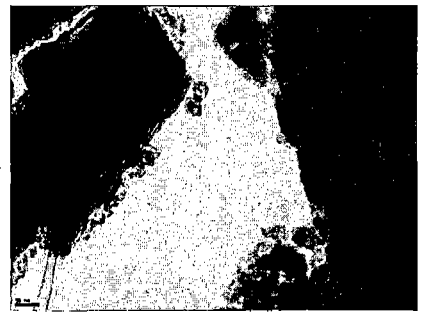
Example 23

CORE-SHELL COMPOSITE INORGANIC METAL OXIDES AND METHOD OF PREPARING FOR PREVENTION OF THERMAL OXIDATIVE DEGRADATION IN POLYMER AND RESIN COMPOSITIONS

This application is related to and claims priority from U.S. Provisional Patent Application No. 61/977,248, filed Apr. 9, 2014, which is incorporated herein by reference.

TECHNICAL FIELD

This patent relates to the field of plastic compositions, engineered resins, fillers, paints, varnishes, lacquers, and processes related to the application of these materials. Specifically, the invention relates to the inorganic encapsulation of metal oxides, mixed-metal oxides, and metal compounds potentially used as additives to impart, color, flame retardancy, process modification, smoke reduction, antimicrobial properties, laser marking, or "activation" as related to the process of laser-direct structuring and many additional functions demonstrated in the art. Particularly, the invention is useful when the metal oxide, mixed-metal oxide, or metal compound is present during the steps of compounding and extrusion, followed by an additional forming, shaping, curing, or molding step or subsequent exposure to electromagnetic radiation, assembly, bonding, coating, or metal plating. Furthermore, the invention minimizes the impact of thermal oxidative degradation to the plastic and coatings compositions during processing and additional thermal exposures.

BACKGROUND

In desirable circumstances, materials added to plastic or coating formulations to achieve one beneficial result can produce another detrimental result, such as diminished mechanical properties from thermal oxidation degradation of the polymer. Thus, desired benefit of the additive together with the desired mechanical strength cannot be achieved simultaneously. Such is the case with additives for laser marking or coloration, such as the incorporation of certain colored inorganic metal oxides, metal compounds, and mixed-metal oxide pigments, the additive materials necessary for laser direct structuring and for other value-adding additives. In these noted instances, it is desirable to have a method to incorporate these materials into plastic and coatings or paint formulations while protecting the resulting materials from oxidative damage.

Inorganic colored pigments are based upon crystalline materials comprised of oxides of mixed metals. The materials are generally described in the published brochure of the Dry Color Manufacturer's Association (DCMA), now called CPMA, of 1117 N. 19th St., Suite 100, Arlington, Va. 22209, (1991), entitled Classification and Chemical Descriptions of the Complex Inorganic Colored Pigments, see particularly pages 9 to 35.

Laser Direct Structuring (LDS) refers to the process of selective metallization of defined regions after impingement of laser irradiation "activation" on a substrate containing an additive that releases a metal "seed" capable of promoting the deposition of metal atoms from solution to form a conductive pathway. The practice is disclosed in U.S. Pat. No. 7,060,421, Naundorf, et al., issued Jun. 13, 2006. In an LDS process, a computer-controlled laser beam travels over the molded thermoplastic article to activate the plastic surface at locations where a conductive metal path is desired, thus, "structuring" the article. With a laser direct structuring process, it is possible to obtain small conductive path widths (such as of 150 micrometers or less). Conductive paths are realized after structuring of thermoplastic surface and subsequent exposure of the structured article to a metal plating bath or series of metal plating baths.

The term "plastics" covers a range of synthetic or semi-synthetic compounds that are the products of polymerization reactions. They are composed of organic condensation or addition polymers and may contain other substances to improve performance or durability or other advantageous benefits. There are a few natural polymers generally considered to be "plastics", however, most are synthetic organic derivatives. Plastics are formed into sheets, objects, films, laminates, and fibers. They are very versatile in processing, offering a very broad applicability in diverse markets.

Plastics can be classified in many ways, but most commonly by their polymer backbone and material properties. Thermoplastics can be repeatedly melted and reshaped, whereas processing of thermoset plastics produces cross-links that cannot be reversed. Both materials have a plurality of uses. Examples of thermoplastics are polyvinyl chloride, polyethylene, polymethyl methacrylate, and other acrylics, olefins, aromatics, silicones, polyurethanes etc. Other classifications include thermoplastic resins, engineering plastics, and products of addition or condensation reactions. The so-called thermoplastic rubbers and thermoplastic elastomers are also included in the definition of thermoplastic resin. Thermoplastic resins per se include polyolefins, polystyrenes, polycarbonates (PC), polyesters, acrylonitrile butadiene styrenes (ABS), ABS copolymers, polyvinyl chloride (PVC), unplasticized polyvinyl chloride (UPVC), polyphenylene oxide (PPO), polyamides, polyurethanes (TPU), acrylic polymers, polysulfone polymerss and others.

The term "thermoset or "thermoset plastic" or "resin", as used herein, refers to any plastic that can be formed into a shape during manufacture, but which sets permanently rigid upon further heating. This is due to extensive cross-linking that occurs upon heating, which cannot be reversed by reheating. Examples include phenol-formaldehyde resins, epoxy resins, polyesters, polyurethane, silicones and combinations thereof. Thermoset resins most often used in the present invention include epoxy resins ("epoxies"), polyimide resins ("polyimides"), bismaleimide resins (e.g., bismaleimide trizaine (BT)), and combinations thereof. Additionally, the term "resin" may refer to any reactive monomeric, polymeric, and/or functionalized material that hardens to form a film or "coating" commonly utilized in compositions of paints, lacquers, varnishes, or emulsion utilized for forming a decorative or functional coating on an article. Noted examples of coatings resins, include alkyds, acrylates, epoxies, urethanes, polyesters, and many hybrid systems that are compounds or mixtures or the like, for example perfluoroacrylates, or siliconized polyesters. Thermoset elastomers are a unique class of resins and are included in the definition of thermoset plastic as well as, analogous relationship for elastomeric resins employed in coatings.

The definition of plastic additive is any material that is added to a plastic or polymer to enhance or modify their original physical and/or chemical properties. The definition of filler, in the sense relating to plastics, is a plastic additive, solid substance, which is added to a polymer to displace plastic material. Inclusion of fillers can positively or negatively modify plastic properties. Often they are inert inorganic or cellulosic materials. Additives are used extensively to reduce cost, improve mechanical properties, impart color, enhance processing, or add new functionality, such as, laser marking and other beneficial attributes known to one skilled in the art. The effect of fillers on the mechanical properties of polymers depends on their specific surface area, particle size, shape, and reactivity with the plastic matrix.

According to the prior art for laser marking, a plastic or coating composition can be adjusted in such a way that it can be inscribed by laser light, whether by choosing a grade of plastic having good laser inscription properties or more commonly by incorporating a plastic additive which changes color under the effect of laser irradiation. Such laser marking additives may be metal oxides, mixed-metal oxides, or metal compounds in compositions of metal oxides, mixed-metal oxides, or metal compounds as to cause thermal oxidative damage to the plastics or resin in which they are incorporated. Various materials are known in the art that are laser reactive (e.g., capable of changing color when contacted by a laser beam). As described in U.S. Pat. No. 4,861,620, Azuma et al, U.S. Pat. No. 4,753,863, Spanjer, and U.S. Pat. No. 4,707,722, Folk et al, the part or component may be partially comprised of the laser markable material or have a coating of the material on the surface of the part or component to be marked.

However, in most cases, the amount of color contrast which is achieved by known laser marking methods is not as high as desired. Accordingly, there is an ongoing need for additives which can cause significant color changes to occur in the polymeric materials in which they are incorporated. Moreover, it is highly desirable that these additives not deleteriously affect the beneficial physical properties of the polymers. Application of an inert shell consisting of one of the oxides described can mitigate the effect of thermal oxidative degradation and thus increase the functionality of laser marking additives in plastics sensitive to thermal oxidative damage.

Examples of additive materials include lubricants, process aids, cross-linking agents, release agents, colorants, flame retardants, anti-microbial agents, accelerators, inhibitors, enhancers, compatibilizers, stabilizers, blowing agents, foaming agents, conductive or anti-static, dielectrics, and, in a specific application, laser-direct structuring (LDS) additives. Additives for LDS are defined as metal-containing materials that, after structuring, yield a seeded surface for metal deposition. Additives for LDS materials are usually spinel-based metal oxides, such as copper chromium oxide; metal salts, such as copper hydroxide phosphate; organic metal complexes, and the like. Additionally, many other additives are known in the art. A nearly exhaustive overview of the art is published in the Plastic Additive Handbook, 2009, 6th edition, by Hanser Publications.

Some of the problems associated with plastics are their heat sensitivity, their poor wear and mechanical properties, and easy decomposition due to chemical and radiation-based interactions. These interactions can negatively impact the functionality of the finished plastic articles. The presence of excessive thermal oxidative deterioration leads to loss of mechanical strength, embrittlement, discoloration, and premature failure. Frequently, the source of degradation is long-term environmental exposure, but it can also occur in the processing of plastics particularly during processing stages where heat is used to increase flowability prior to producing the finished article. Undesired chemical reactions propagated by heat, include depolymerization or oxidation of the polymer components through interactions with itself, fillers, additives, or environmental and atmospheric chemical components.

Thermal oxidative degradation of plastic is well studied for the recovery and disposal of waste plastic. The precise reaction mechanisms that lead to the depolymerization and oxidation of the plastic components have not been thoroughly elucidated but contributing factors include the presence of acids, exposure to electromagnetic radiation such as UV- and IR-radiation, ozone, and additional internal and external influences. Particularly, the presence of certain metal-containing compositions has been shown to greatly accelerate ("catalyze") the decomposition of plastic materials. The acceleration is observed as a decrease in the onset temperature of the reaction as measured by a mass loss and release of gaseous by-product driven by exposure of the sample to heat.

Catalysis resulting in thermal oxidative degradation is partially dependent on the composition of the plastic, the types of additives, the degree of thermal exposure, catalytic activity, concentration in plastic, specific surface area, and presence of anti-oxidants. Metals, metal salts, metal-containing compounds, metal oxides, and mixed-metal oxides have been noted to promote the thermal oxidative degradation of polymers, monomeric components of polymers, and finished thermoplastics articles. Notable examples, of metal-containing materials that can catalyze and promote the rate of degradation include oxides, salts, organic complexes, and compounds containing solely or mixtures of V, Zr, Bi, Cu, Co, Ag, Mo, Zn, Nd, Pr, La, Mg, Al, Ru, Ti, Cr, Ce, Mn, Ni, Pd, Pt, Sn, Fe, Sb, and Ca. For specific examples of compositions, see Gupta et. al, Ind. Eng. Chem. Res. (37), 1998, 2702-2712 and Terakado et. al. J. Anal. App. Pyrolysis (91), 2011, 303-309. Other examples are likely known to those skilled in the art of waste plastic reformation, cracking, recycling, recovery, or disposal.

Thermoset plastics and many coating compositions use identical or related resins and share identical reactive chemical functional groups. Thermal oxidative degeneration of these materials can also be promoted in the same process conditions of heating in combination with one of the above metal-containing oxides, salts, organic complexes, and compounds noted above. Additionally, the effect can be particularly pronounced in uncured resins with active epoxy or acrylate groups.

In some instances it is still desirable to include into thermoplastic, thermoset or coating compositions materials that have been demonstrated to negatively impact the plastic or coating through thermal oxidative degradation. Such is the case when the additive materials contain potentially catalyzing metals but contain additional beneficial properties. Examples of such benefits are in coloration of thermoplastics, particularly the incorporation of complex colored inorganic pigments. Common examples include the degradation of polyvinyl chlorides by iron-bearing pigments, copper compounds, and minerals, and for addition of laser marking or LDS additive materials necessary for laser marking and laser direct structuring and where the benefits of other metal-containing fillers and additives are desirable. In these noted instances it is desirable to have a method to incorporate materials into plastic formulations while protecting the thermoplastic from thermal oxidative degradation from the chemical nature of the materials.

BRIEF SUMMARY

The present invention relates to the synthesis and application of a core-shell material comprised of one or more metal-containing species coated with an inorganic shell comprised of an additional layer or layers of metal oxides.

The core comprises discrete inorganic particles of homogenous particle distribution. The core material may be of any metal oxide, metal compound, or mixed-metal oxide with particular attention to those metals that have been shown to promote thermal oxidative degradation. These may particularly include elements classified as alkali-earth metals, transition metals, basic metals, rare-earth metals, and semi-metals. Mixed-metal oxides are products of high-temperature calcination or other energy-intensive treatment. More specifically, the invention embodies only compositions of oxides of metal or a plurality of metals coated with an additional layer or layers of inorganic oxides that are also combined with thermoplastic resins and additionally processed by exposure to thermal processes, electromagnetic radiation, or in use of finished articles produced are exposed to elevated temperatures or intensive sources of electromagnetic radiation.

The invention is particularly suited for thermoplastics that contain aromatic functionality, or are particularly sensitive to oxidative damage, or are processed at high temperatures. However, the invention is applicable to thermoset plastics and coating resins that share similar aromatic structure, are particularly sensitive to oxidative damage, or are processed at high-temperature. Examples of some thermoplastic composition include polycarbonates (PC), thermoplastic polyurethanes (TPU), acrylonitrile butadiene styrenes (ABS), substituted methylmethacrylates (MMA), polyphenylene oxides (PPO), nylon, polyvinylchlorides (PVC), polyethlyenes (PE), acrylates, styrenes, and the like, and mixtures of the above, to produce engineered plastic compositions, mixtures and alloys. Additionally, a thermoplastic composition may include multiple resins or additional chemical moieties appended to the polymeric backbone, for example, polymerized products having fluorine substitution.

With regard to the particulate material that provides the metal oxide surface for formation of the shell material, the core particle may range in size from about 0.05 to about 50 μm diameter, but preferably is from about 0.3 μm to about 2.0 diameter or similar. The core material may be raw stock or processed through numerous attrition and grind steps prior to, or concurrently with, the deposition of the shell.

The shell comprises an additional metal oxide(s) and completely encapsulates the core particle such that the particle surface chemically reflects that of the shell material. Deposition of the shell does not alter the homogenous distribution of the measured particle size distribution as determined by laser light scattering spectrometry. The shell is generally precipitated from an aqueous solution of the appropriate B, Ti, Ni, Al, Zr, Co, Mg, Mo, Zn, Si, Sn, Bi, Cr, W, Ce, Mn, and Ba metal salts. The resulting encapsulating shell may be a unique metal oxide or a mixture of metal oxides present as amorphous oxide mixtures, ceramic, or glass shells.

Additional metal oxides may be deposited onto the core in a similar manner in subsequent deposition steps or a mixture of metal oxides may be co-deposited in a single deposition step. Deposition of the shell is controlled by slow precipitation of the metal species from the dissolved salt solution; however, other methods common in the art, such as sol-gel, chemical vapor deposition, physical vapor deposition, or spray-pyrolysis deposition, may also be used. Properties of the shell, such as shell thickness and density, may be altered by changing deposition rates, metal concentrations, ratios of core material to shell precursors, and by the addition of other stabilization aids.

The resulting product core-shell material is dried and cured at an elevated temperature, dependent upon the materials of composition, to induce crystallization and/or oxide formation and can be subjected to additional deagglomeration steps after calcination. Examples of such steps include jet-milling, pulverizing and other particle size reduction techniques known to the art.

Examples of shell materials include $SiO_2$, $Zn_2SiO_4$, $Al_2O_3$, $Bi_2SiO_5$, $Bi_2O_3$, $ZnO$, $WO_3$, $Cr_2O_3$, $ZrO_2$, $MoO_3$, $TiO_2$, and $Ni_2SiO_4$, but may be from any elemental material whose water soluble salt is capable of transformation into an oxide upon precipitation. Also included are materials composed of an inorganic pigment core such as a copper chrome oxide spinel particle, and a shell of single metal oxides such as $SnO_2$, $NiO$, and $SiO_x$, wherein, x is any number commonly designated in the class of amorphous silicas. The shell material can comprise from about 0.5% to about 40% by weight of the total particle mass. Preferred compositions are from about 3% to about 18% by weight of the shell material.

The finished plastic composition contains from about 60% to about 98% by weight solids of one or more plastic resins, 0.25% to 16% by weight solids of core-shell material embodied by the invention, and 0% to 24% by weight solids of additional fillers and additives. Formulation for laser marking contains from about 60% to about 98% by weight solids of one or more plastic resins, 0.1% to 6% by weight solids of core-shell material embodied by the invention, and 0% to 24% by weight solids of additional fillers and additives. Especially useful combinations for laser direct structuring applications, the present invention provides a thermoplastic composition including from about 10 to 90% by weight of a thermoplastic base resin, from about 0.1 to 30% by weight of a laser direct structuring additive or mixture of laser direct structuring additives where at least one additive is the core-shell metal oxide embody in the invention, and 0 to about 60% by weight of at least one ceramic filler; wherein the plastic compositions are capable of being plated with a conductive layer of metal after being activated by exposure to laser activation. One skilled in the art would recognize a plurality of core-shell materials, pigments, fillers, LDS additive, and additional additives that may be present in the plastic and coatings compositions.

All ratios and percentages noted herein are "by weight" unless otherwise noted. All patents and publications cited are incorporated herein by reference.

BRIEF DESCRIPTION OF THE FIGURE

FIG. 1 includes transmission electron micrographs of the materials made in Examples 17, 18, 21 and 23 of the present application.

DETAILED DESCRIPTION

The present invention provides for the composition and method of synthesis for core-shell composite inorganic particles in uses typical of plastic materials. These core-shell composites provide for a method to control the properties of the final thermoplastic or thermoset composition and minimize thermal oxidative degradation during processing and potentially impacting the lifespan of the finished article; particularly for aromatic thermoplastic, thermoset, and coating compositions subjected to thermal processing steps of curing, drying, compounding, extrusion, thermoforming, and/or molding.

The core-shell composite particles produced originate from distinct particles of composition typically used as fillers, inorganic pigments, laser marking additives, LDS additives, or plastic additives, but the composition of the core material is not narrowly critical and other materials that contain surface oxide groups or display surface affinity for the named core materials, other then those specifically named, can be used. Furthermore, encapsulation of the core material does not lead to a significantly-broadened particle size distribution, merely a measured increase in the measured mean particle size.

Shell materials can be any material from a class that includes inorganic silicates, and single or multiple metal oxides of the elements; B, Ni, Zn, Al, Zr, Si, Sn, Bi, W, Mo, Cr, Mg, Mn, Ce, Ti, and Ba (or mixtures thereof). The shell completely encapsulates the core material but may vary significantly in thickness and composition. Typical shell thicknesses range from about 2 nm to about 250 nm, more preferably from about 6 nm to about 150 nm. The shell material comprises from about 2% to about 30% by weight of the total sample mass.

Precipitation of the shell material is performed in slurry containing the core material, and selection of metal chelate, metal complexes, and dissolved metal salts. It is understood that precursors suitable for liquid medium are necessarily solvated first in the medium and may differ from the materials named directly. Choices for starting materials may include oxides and ground-state metals, but these require additional processing steps for solubility. Suitable raw materials for shell formation are not limited to, but more preferentially are, tin acetate, tin bromide, tin chloride, tin ethoxide, tin ethylhexanoate, tin fluoride, tin iodide, tin isopropoxide, tin methoxide, tin oxalate, tin sulfate, tin phosphate, tin pyrophosphate, boric acid, boron phosphate, boron tribromide, boron trichloride, boron nitride, barium acetate, barium bromoate, barium carbonate, barium chloride, barium ethoxide, barium boride, barium ethylhexanoate, barium hydroxide, barium isopropoxide, barium hydrogen phosphate, barium metaborate, barium phosphate, barium nitrate, barium oxalate, barium pentanedionate, barium perchlorate, barium peroxide, barium sulfate, barium tartrate, barium thiosulfate, titanium boride, titanium chloride, titanium bromide, titanium butoxide, titanium ethoxide, titanium ethylhexanoate, titanium hydride, titanium isopropoxide, titanium nitride, titanium propoxide, titanium lactate, titanium sulfate, titanium oxysulfate, nickel acetate, nickel bromide, nickel carbonate, nickel chloride, nickel lactate, nickel nitrate, nickel sulfate, nickel perchlorate, nickel phosphate, chromium acetate, chromium sulfate, chromium chloride, chromium nitrate, chromium perchlorate, chromium phosphate, chromium sulfate, magnesium acetate, magnesium bromide, magnesium butoxide, magnesium carbonate, magnesium chloride, magnesium citrate, magnesium ethoxide, magnesium phosphate, magnesium methoxide, magnesium nitrate, magnesium oxalate, magnesium perchlorate, magnesium phosphate, magnesium pyrophosphate, magnesium sulfate, magnesium tetraborate, magnesium thiosulfate, zinc acetate, zinc bromide, zinc chloride, zinc nitrate, zinc butoxide, zinc carbonate, zinc citrate, zinc oxalate, zinc sulfate, molybdenum acetate, molybdenum bororide, molybdenum chloride, molybdenum isopropoxide, molybdenum sulfide, molybdic acid, molybdenyl acetylacetonate, molybdophosphoric acid, aluminum ammonium sulfate, aluminum acetate, aluminum bromide, aluminum chloride, aluminum butoxide, aluminum isopropoxide, aluminum nitrate, aluminum oxalate, aluminum sulfate, aluminum lactate, aluminum metaphosphate, manganese acetate, manganese acetylacetonate, manganese bromide, manganese carbonate, manganese chloride, manganese formate, manganese hypophosphite, manganese nitrate, manganese oxalate, manganese phosphate, manganese sulfate, tungsten boride, tungsten chloride, tungsten ethoxide, tungsten isopropoxide, tungstic acid, zirconium acetate, zirconium butoxide, zirconium carbonate, zirconium boride, zirconium bromide, zirconium carbonate hydroxide, zirconium chloride, zirconium oxychloride, zirconium oxynitrate, zirconium hydride, zirconium isopropoxide, zirconium lactate, zirconium sulfate, zirconium propoxide, zirconyl perchlorate, bismuth acetate, bismuth bromide, bismuth citrate, bismuth carbonate, bismuth, ethylhexanoate, bismuth hydroxide, bismuth isopropoxide, bismuth phosphate, bismuth sulfate, bismuth oxychloride, bismuth chloride, bismuth nitrate, bismuth oxynitrate, bismuth perchlorate, cerium acetate, cerium nitrate, cerium sulfate, cerium bromide, cerium carbonate, cerium chloride, cerium hydroxide, cerium isopropoxide, cerium methoxyethoxide, cerium oxylate, cerium perchlorate, cerium phosphate, cerium sulfate, cerium pentanedionate, boric acid, sodium borate, silicic acid, silicon tetraacetate, silicon chloride, silicon bromide, trimethylsilyl iodine, sodium silicate, tetraethylorthosilicate, potassium silicate, colloidal silica, silanes, tetraethylorthosilicate, and related compounds, as well as mixtures thereof.

Core materials which may be used in the invention include metals, metal oxides, metal compounds, and mixed-metal oxides that are useful in plastic and coatings compositions, but may profoundly effect the mechanical stability or usefulness of the finished plastic article. Specifically of interest, but not intending to be exclusive, are core or core-shell compositions that are suitable for pigmentation, laser marking, or LDS additives where thermal oxidative degradation can be initiated through reactivity with the core oxide or a solubilized product of the core. Copper oxides, copper hydroxide, copper phosphate, copper (II) hydroxide phosphate, basic copper phosphate and the polymorphs of copper, hydroxide, and phosphate are non-limiting examples of such materials. In addition to the plastic resin, the compositions of the present invention also include a laser direct structuring (LDS) additive.

The LDS additive is selected to enable the composition to be used in a laser direct structuring process. In an LDS process, a laser beam exposes the LDS additive to place it at the outermost surface of the irradiated substrate and activate metal atoms from the LDS additive. The use of plastic substrates in LDS processes include the inclusion of LDS additive in thermoplastic articles and more recently articles of thermoset plastics and elastomers and coatings applied as paint varnish, lacquer through spray brush or other methods in the art that can be applied to a plurality of substrates.

As such, the LDS additive is selected such that, upon exposure to a laser beam, metal atoms are activated and exposed and in areas not exposed by the laser beam, no metal atoms are exposed. In addition, the LDS additive is selected such that, after being exposed to laser beam, the etched area is capable of being plated to form conductive structure. As used herein "capable of being plated" refers to a material wherein a substantially uniform metal plating layer can be plated on laser-etched area. These irradiated additive particles act as nuclei for the crystal growth during a subsequent plating process, such as a copper plating process. Other electroless plating processes that may be used include, but are not limited to, gold plating, nickel plating, silver plating, zinc plating, tin plating or the like.

LDS additives are metals, metal oxides or mixed-metal oxides. Particularly suitable are mixed-metal oxide spinel products of high-temperature calcination. For the above materials, thermal oxidative degradation based on the incorporation in thermoplastic resins has been recently documented. Noteworthy examples are disclosed in U.S. Published Patent Application 2011/0251326 A1, Van Hartingsveldt, et al., issued Oct. 13, 2011. Specifically, it is disclosed in U.S. Pat. No. 7,083,848, and U.S. Pat. No. 7,060,421, that the presence of LDS additive compounds in aromatic polycarbonate compositions results in degradation of the polycarbonate, resulting in a decrease of the melt stability of the compositions and thus in less stable processing. In one embodiment of the invention, the metal oxides typified in U.S. Pat. No. 7,060,421 are to be encapsulated in shell material comprising from about 0.5% to about 40% by weight of the total particle mass. Such examples include spinel or spinel-related structures containing copper, chromium, iron, cobalt, nickel or a mixture of two or more of the foregoing. Copper may be particularly advantageous. It may further be advantageous if the inorganic oxides or compounds contain copper, chromium, iron, cobalt, nickel or mixtures thereof. Preferred compositions are from about 3% to about 18% by weight of the shell material. The shell material may be any of the aforementioned metals and corresponding metal oxides as a single layer or combination of layers, preferentially, $SiO_2$, $Zn_2SiO_4$, $Al_2O_3$, $Bi_2SiO_5$, $Bi_2O_3$, ZnO, $WO_3$, $Cr_2O_3$, $ZrO_2$, $MoO_3$, $TiO_2$, and/or $Ni_2SiO_4$, more preferentially, $SiO_2$, $Al_2O_3$, $Bi_2O_3$, $WO_3$, and/or $ZrO_2$, even more preferentially, $SiO_2$, and/or $Al_2O_3$.

In another embodiment of the invention, the metal oxides typified in U.S. Pat. No. 7,083,848 are encapsulated in shell material comprising from about 0.5% to about 40% by weight of the total particle mass. Such examples include compounds of metals of the d and f group of the Periodic Table of the Elements with non-metals. The core metal-containing compounds are particularly preferably metal oxides, in particular monooxides of the d-metals of the Periodic Table of the Elements. In one particularly preferred embodiment of the invention, the higher oxides are spinels, in particular copper-containing spinels, such as $CuCr_2O_4$. Suitable copper-containing spinels are commercially available, an example being PK 3095 from Ferro (DE) or BK1G from the Shepherd Color Company. Copper oxides of the formula CuO or $Cu_2O$ are also particularly suitable, and use can be made here of nanoparticles, such as NANOARC® Copper Oxide from Nanophase Technologies Corporation, Illinois, USA, or similar nanosized materials of $Cu_2O$. Preferred compositions include from about 3% to about 18% by weight of the additive material. Additionally, for application in polypropylene, Jellinek et. al., J. Poly. Sci. (17), 1979, 1493-1522, notes the catalyzing properties of uncoated CuO and $Cu_2O$ toward oxidative decomposition of the resin. The shell material may be any of the forementioned, preferentially $SiO_2$, $Zn_2SiO_4$, $Al_2O_3$, $Bi_2SiO_5$, $Bi_2O_3$, ZnO, $WO_3$, $ZrO_2$, $Cr_2O_3$, $MoO_3$, $TiO_2$, and/or $Ni_2SiO_4$, more preferably $SiO_2$, $Al_2O_3$, $Bi_2O_3$, $WO_3$, and/or $ZrO_2$, even more preferentially $SiO_2$, and/or $Al_2O_3$.

Another embodiment of the inventions include oxides noted by Gupta et. al, Ind. Eng. Chem. Res. (37), 1998, 2702-2712, and Gupta et. al. J. of Thermo. Anal. (46), 1996, 1671-1679, that are encapsulated in shell material comprising from about 0.5% to about 40% by weight of the total particle mass. Particularly, these oxides are for use in applications of plastic composed of or containing poly(vinyl chloride) and polycarbonate. Examples, of these oxides include, but are not limited to, $ZrO_2$, $MoO_3$, $V_2O_5$, $TiO_2$, $Sb_2O_3$, $SnO_2$, $Cr_2O_3$, $CeO_2$, $Cu_2O$, CuO, and $MnO_2$. Preferred compositions include from about 3% to about 18% by weight of the shell material. Combinations and compounds of the above are included. The shell material may be any of the forementioned, preferentially $SiO_2$, $Zn_2SiO_4$, $Al_2O_3$, $Bi_2SiO_5$, $Bi_2O_3$, ZnO, $WO_3$ and/or $Ni_2SiO_4$, more preferentially $SiO_2$, $Al_2O_3$, $Bi_2O_3$, and/or $WO_3$, even more preferentially $SiO_2$, and/or $Al_2O_3$.

In practice, particles of the core material are stirred into water at from about 0.5% to about 30% weight percent concentration. The pH of the solution is adjusted, for example, with 3M NaOH, 3M $H_2SO_4$, phosphoric acid, or acetic acid to the appropriate pH. The pH is selected so as not to induce destabilization of the metal salt solution upon addition to the core-containing slurry. The solution containing the dissolved metal salt is added under agitation and allowed to equilibrate before the precipitation of the metal salt(s). Reactions that utilize colloidal silica are started identically. All reactions may or may not contain additional complexation aids and may be performed at elevated temperature to further induce precipitation and condensation of the shell onto the core particle. The precipitation reaction is controlled by a careful approach to the isoelectric point of the particle for deposition of colloidal particles or below the pH where instant precipitation of the metal oxide species occurs. Slow addition of the acid or base is accomplished by titering in a small amount of acid or base at a known rate. Reaction may take from about 1 to about 12 hours given the concentration of the acid or base, the buffering power of the solution, the temperature of the reaction, and the rate of addition. The precipitated material preferentially deposits onto the core particles resulting in a homogenous shell of measurable thickness. The roughness and density of the shell material varies with composition.

For composite shells that require multiple materials to be deposited, simultaneous precipitations can be completed provided the precursor materials are stable at the same pH and deposit completely onto the core material avoiding the formation of new materials in the solution. This is the case for zirconium oxychloride and sodium silicate that both are soluble at pH 12 and, if adjusted slowly with 3M $H_2SO_4$ through pH=8, both deposit onto the core material. Cross-reaction and complex formation is permitted with the precursor materials provided the by-products deposit onto the core particle.

A second route to deposition of multiple materials uses two complete and distinct precipitation reactions. The materials need not be stable at the same pH but both must be insoluble at the end points of the reactions and one species has to be insoluble at the initial precipitation conditions for the second material. For example, a solution of nickel sulfate has been started at a pH=2 in acidified water. Nickel oxide complex is then precipitated by addition of a strong base. Base addition continues until a pH=11 is reached and sodium silicate precursor solution is added and allowed to equilibrate before addition of an acid solution to pH=8. The resulting core particle is coated with sequential layers of nickel oxide and silicate complex.

As noted above, the prerequisite for practice of the invention is the condition that the shell material completely encapsulates the core particle. This requirement does not extend to the addition of a second or additional outer shell material. There is the possibility of simultaneous deposition of multiple materials onto the core that yields hybrid mixed-metal oxide shells. Another outcome is the formation of new hybrid soluble compound in the aqueous phase prior to deposition that yields materials containing entrained organic or inorganic materials. Likewise, the stoichiometry of the desired end product may not yield a molar ratio of core to shell components that results in a continuous or homogenous outer-shell, nor can the inter-penetration of one shell material into the core material be discounted. For formation of the final crystalline, metal oxide, or mixed-metal oxide coated product, little dependence on the order of deposition of precursor materials has been demonstrated.

To promote crystallization, densification, dehydration, or solidification of the shell materials or condensation of any surface pendant hydroxyl groups to oxide, calcinations of the coated core material may be required. The temperature and time is dependent upon the material of composition but effective ranges are from about 100 to about 1000 degrees Celsius, more preferably exposure from about 150 to about 300 degrees Celsius, with dwell times from about 30 to about 600 minutes. Formation of crystalline material can be avoided by correcting the calcination temperatures to promote only condensation for the formation of glass-like shells or amorphous metal oxides. This is desirable where crystalline phases are a health risk, such as, the case of crystalline silica which is considered a carcinogen.

Morphological inspection of the particles after calcination reveals shells of irregular thickness and roughness. This is primarily caused by manner of deposition of the core materials. It is known that by regulation of the rate of deposition of materials density and morphology of the shell material can be altered. Some morphology is transferred from the core material. The core material may vary drastically in surface roughness, features, and shape reliant upon the particulate material and nature of processes applied prior to deposition of shell materials. The non-uniformity of the coating or irregular shape of the particle does not detract from the usefulness or fitness of the final product.

The following examples detail experimental methods used to synthesize the metal oxide or mixed-metal oxide coatings onto the pigment particles. The methods were conducted in filtered deionized water under ambient pressure, atmosphere and, unless noted, at 20 to 22 degrees Celsius. The examples are merely illustrative, and are not intended to be limiting of the present invention.

X-ray fluorescence spectrometry was used to determine the elemental composition of the reaction products. The results are reported in Table 1. The measured elemental composition is consistent with the expected yield and deposition of the reaction starting materials. The results are representative of the materials produced within the invention, but are not intended to define or limit the invention.

Example 1

Add 500 g copper chromite spinel BK30C965 to 1674 mL DI $H_2O$. Mix with rapid agitation. Heat to 100° C. Raise the pH of the slurry to 9.5 using 3M NaOH. Add 304 g of 29% sodium silicate solution to 100 mL DI $H_2O$. Add 20 g concentrated sulfuric acid to 300 mL DI $H_2O$. Simultaneously add solutions to heated agitating slurry at 1.2 g/min. Continue heating and stirring for one hour post addition. Stir 24 hours with no heat. Adjust pH to 7.5 using 0.5M sulfuric acid. Filter slurry, wash using DI $H_2O$, and dry in 105° C. oven.

Example 2

Add 186 g Example 1 product to 1014 mL DI $H_2O$. Mix with rapid agitation. Heat to 100° C. Raise the pH of the slurry to 9.5 using 3M NaOH. Add 113 g of 29% sodium silicate solution to 100 mL DI $H_2O$. Add 15 g concentrated sulfuric acid to 240 mL DI $H_2O$. Simultaneously add solutions to heated agitating slurry at 1.2 g/min. Continue heating and stirring for one hour post addition. Stir 24 hours with no heat. Adjust pH to 7.5 using 0.5M sulfuric acid. Filter slurry, wash using DI $H_2O$, and dry in 105° C. oven.

Example 3

Add 648 g copper (I) oxide slurry to 610 mL DI $H_2O$ (overall 16-18% solids). Mix with rapid agitation. Heat to 100° C. Adjust pH of slurry to 9.5-10 using 3M NaOH. Add 228 g of 29% sodium silicate solution to 815 mL DI $H_2O$. Add 28.3 g concentrated sulfuric acid to 965 mL DI $H_2O$. Simultaneously add solutions to heated agitating slurry. Addition rates will vary and the pH must remain between 9.5-10.5. Continue heating and stirring for one hour post addition. Stir 24 hours with no heat. Filter slurry, wash using DI $H_2O$, and dry in 105° C. oven.

Example 4

Add 845 g copper (I) oxide slurry to 796 mL DI $H_2O$ (overall 16-18% solids). Mix with rapid agitation. Heat to 100° C. Adjust pH of slurry to 9.5-10 using 3M NaOH. Add 174 g of 29% sodium silicate solution to 620 mL DI $H_2O$. Add 21.5 g concentrated sulfuric acid to 734 mL DI $H_2O$. Simultaneously add solutions to heated agitating slurry. Addition rates will vary and the pH must remain between 9.5-10.5. Continue heating and stirring for one hour post addition. Stir 24 hours with no heat. Filter slurry, wash using DI $H_2O$, and dry in 105° C. oven.

Example 5

Add 835 g copper (II) oxide to 1296 mL DI $H_2O$ (overall 10-12% solids). Mix with rapid agitation. Heat to 100° C. Adjust pH of slurry to 9.5-10 using 3M NaOH. Add 152 g of 29% sodium silicate solution to 543 mL DI $H_2O$. Add 18.9 g concentrated sulfuric acid to 643 mL DI $H_2O$. Simultaneously add solutions to heated agitating slurry. Addition rates will vary and the pH must remain between 9.5-10.5. Continue heating and stirring for one hour post addition. Stir 24 hours with no heat. Filter slurry, wash using DI $H_2O$, and dry in 105° C. oven.

Example 6

Add 793 g copper (II) oxide to 1562 mL DI $H_2O$ (overall 10-12% solids). Mix with rapid agitation. Heat to 100° C. Adjust pH of slurry to 9.5-10 using 3M NaOH. Add 127 g of 29% sodium silicate solution to 453 mL DI $H_2O$. Add 15.8 g concentrated sulfuric acid to 537 mL DI $H_2O$. Simultaneously add solutions to heated agitating slurry. Addition rates will vary and the pH must remain between 9.5-10.5. Continue heating and stirring for one hour post addition. Stir 24 hours with no heat. Filter slurry, wash using DI $H_2O$, and dry in 105° C. oven.

Example 7

Add 693 g copper (II) oxide to 1457 mL DI $H_2O$ (overall 10-12% solids). Mix with rapid agitation. Heat to 100° C. Adjust pH of slurry to 9.5-10 using 3M NaOH. Add 150 g of 29% sodium silicate solution to 537 mL DI $H_2O$. Add 18.6 g concentrated sulfuric acid to 635 mL DI $H_2O$. Simultaneously add solutions to heated agitating slurry. Addition rates will vary and the pH must remain between 9.5-10.5. Continue heating and stirring for one hour post addition. Stir 24 hours with no heat. Filter slurry, wash using DI H₂O, and dry in 105° C. oven.

Example 8

Add 450 g copper (I) oxide to 1350 mL DI H₂O. Mix with rapid agitation. Heat to 100° C. Raise the pH of the slurry to 9.5 using 3M NaOH. Add 99 g of 29% sodium silicate solution to 150 mL DI H₂O. Add 20 g concentrated sulfuric acid to 300 mL DI H₂O. Simultaneously add solutions to heated agitating slurry at 1.2 g/min. Continue heating and stirring for one hour post addition. Stir 24 hours with no heat. Adjust pH to 7.5 using 0.5M sulfuric acid. Filter slurry, wash using DI H₂O, and dry in 105° C. oven.

Example 9

Add 953 g copper (II) oxide 20% solids aqueous to 691 mL DI H₂O (overall 20-22% solids). Mix with rapid agitation. Heat to 100° C. Adjust pH of slurry to 9.5-10 using 3M NaOH. Add 207 g of 29% sodium silicate solution to 738 mL DI H₂O. Add 25.6 g concentrated sulfuric acid to 873 mL DI H₂O. Simultaneously add solutions to heated agitating slurry. Addition rates will vary and the pH must remain between 9.5-10.5. Continue heating and stirring for one hour post addition. Stir 24 hours with no heat. Filter slurry, wash using DI H₂O, and dry in 105° C. oven.

Example 10

Sample is prepared following a replicate of procedure used in Example 9.

Example 11

Add 996 g copper (II) oxide to DI H₂O (overall 20-22% solids). Mix with rapid agitation. Heat to 100° C. Adjust pH of slurry to 9.5-10 using 3M NaOH. Add 207 g of 29% sodium silicate solution to 738 mL DI H₂O. Add 25.6 g concentrated sulfuric acid to 873 mL DI H₂O. Simultaneously add solutions to heated agitating slurry. Addition rates will vary and the pH must remain between 9.5-10.5. Continue heating and stirring for one hour post addition. Stir 24 hours with no heat. Filter slurry, wash using DI H₂O, and dry in 105° C. oven.

Example 12

Add 259 g 6% wt. Cu coated BK1G as Cu oxide to 777 mL DI H₂O. Mix with rapid agitation. Heat to 100° C. Raise the pH of the slurry to 9.5 using 3M NaOH. Add 122 g of 29% sodium silicate solution to 150 mL DI H₂O. Add 20 g concentrated sulfuric acid to 300 mL DI H₂O. Simultaneously add solutions to heated agitating slurry at 1.2 g/min. Continue heating and stirring for one hour post addition. Stir 24 hours with no heat. Adjust pH to 7.5 using 0.5M sulfuric acid. Filter slurry, wash using DI H₂O, and dry in 105° C. oven.

Example 13

Add 279 g 12% wt. Cu-coated BK1G as Cu oxide to 837 mL DI H₂O. Mix with rapid agitation. Heat to 100° C. Raise the pH of the slurry to 9.5 using 3M NaOH. Add 131 g of 29% sodium silicate solution to 150 mL DI H₂O. Add 20 g concentrated sulfuric acid to 300 mL DI H₂O. Simultaneously add solutions to heated agitating slurry at 1.2 g/min. Continue heating and stirring for one hour post addition. Stir 24 hours with no heat. Adjust pH to 7.5 using 0.5M sulfuric acid. Filter slurry, wash using DI H₂O, and dry in 105° C. oven.

Example 14

Add 200 g TiO₂ to 800 mL DI H₂O. Mix with rapid agitation. Dissolve 60 g of stannous chloride with 3M HCl. Add to agitating slurry. Add 200 mL of 3M NaOH to slurry at 1 mil/min. Stir for 2.5 hours post addition. Filter slurry, wash using 4000 mL DI H₂O, and dry in 105° C. oven. Fire in kiln at 200° C.

Example 15

Add 200 g TiO₂ to 600 g DI H₂O. Mix with rapid agitation. Dissolve 56 g copper sulfate in agitating slurry. Add 3 g of ammonium chloride to slurry. Add 150 mL of 3M NaOH to slurry at 1 mL/min. Stir for 2 hours post addition. Filter slurry, wash using 4000 mL DI H₂O, and dry in 105° C. oven. Fire in kiln at 200° C.

Example 16

Add 200 g TiO₂ to 600 mL DI H₂O. Mix with rapid agitation. Dissolve 124 g nickel (II) chloride in agitating slurry. Add 200 mL of 3M NaOH to slurry at 1 mL/min. Stir for 2.5 hours post addition. Filter slurry, wash using 4000 mL DI H₂O, and dry in 105° C. oven. Fire in kiln at 200° C.

Example 17

Add 200 g TiO₂ to 1000 mL DI H₂O. Mix with rapid agitation. Heat to 90° C. Add 65 g of tin (IV) chloride and 6.5 g of antimony trichloride to 300 ml isopropyl alcohol. Add Sn—Sb solution to agitating slurry over three hours. Stir for 15 minutes post addition. Filter slurry, wash using 4000 mL DI H₂O, and dry in 105° C. oven. Fire in kiln at 500° C. for 2 hours. A transmission electron micrograph of this material is shown in FIG. 1.

Example 18

Add 300 g media milled copper (II) oxide to 900 mL DI H₂O (overall 25% solids). Mix with rapid agitation. Heat to 95° C. Adjust pH of slurry to 9.37-9.75 using 3M NaOH. Add 170 g of 29% sodium silicate solution to 680 mL DI H₂O. Add 22 g concentrated sulfuric acid to 789.5 mL DI H₂O. Simultaneously add solutions to heated agitating slurry. Addition rates will vary in order to keep the pH 9.37-9.75. Continue heating and stirring for one hour post addition. Stir 24 hours with no heat. RO wash slurry, spray dry, and jet mill. A transmission electron micrograph of the material made is shown in FIG. 1.

Example 19

Sample is prepared following a replicate of procedure used in Example 18.

Example 20

Add 300 g media milled copper (II) oxide to 900 mL DI H₂O (overall 25% solids). Mix with rapid agitation. Heat suspension to 95° C. Adjust pH of slurry to 9.33-9.66 using 3M NaOH. Add 173.7 g of 29% sodium silicate solution to 681 mL DI H$_2$O. Add 22.13 g concentrated sulfuric acid to 795 mL DI H$_2$O. Simultaneously add solutions to heated agitating slurry. Addition rates will vary in order to keep the pH 9.33-9.66. Continue heating and stirring for one hour post addition. Stir 24 hours with no heat. RO wash slurry, spray dry, and jet mill.

Example 21

Add 300 g media milled copper (II) oxide to 900 mL DI H$_2$O (overall 25% solids). Mix with rapid agitation. Heat suspension to 95° C. Adjust pH of slurry to 9.40-9.82 using 3M NaOH. Add 166.23 g of 29% sodium silicate solution to 665 mL DI H$_2$O. Add 22.05 g concentrated sulfuric acid to 818 mL DI H$_2$O. Simultaneously add solutions to heated agitating slurry. Addition rates will vary in order to keep the pH 9.40-9.82. Continue heating and stirring for three hours post addition. Stir 24 hours with no heat. RO wash slurry, spray dry, and jet mill. A transmission electron micrograph of the material made is shown in FIG. 1.

Example 22

Add 300 g media milled copper (II) oxide to 900 mL DI H$_2$O (overall 25% solids). Mix with rapid agitation. Heat suspension to 95° C. Adjust pH of slurry to 8.98-9.48 using 3M NaOH. Add 166.23 g of 29% sodium silicate solution to 665 mL DI H$_2$O. Add 22.05 g concentrated sulfuric acid to 818 mL DI H$_2$O. Simultaneously add solutions to heated agitating slurry. Addition rates will vary in order to keep the pH 8.98-9.48. Continue heating and stirring for three hours post addition. Stir 24 hours with no heat. RO wash slurry, spray dry, and jet mill.

Example 23

Add 150 g basic copper phosphate, copper (II) hydroxide phosphate to 700 mL DI H$_2$O (overall 16-18% solids). Mix with rapid agitation. Adjust pH of slurry to 7.0 using 3M NaOH. Add 75 g of 38% sodium aluminate solution to 250 mL DI H$_2$O. Add 100 mL concentrated sulfuric acid to 900 mL DI H$_2$O (10% H$_2$SO$_4$).

Simultaneously add solutions to agitating slurry. Addition rates will vary in order to keep the pH 6.3-7.5. Continue stirring for thirty minutes post addition. Filter slurry, wash using DI H$_2$O, and dry in 105° C. oven. Screen material through a 40 mesh brass screen. Dry material at 200° C. for two hours. A transmission electron micrograph of the material formed is shown in FIG. 1.

TABLE IA

Untreated Reference Core Material (Particle Size Distribution, expressed as percentile of population with measured diameters, μm)

| Example | Material | 10% | 20% | 50% | 80% | 90% |
|---|---|---|---|---|---|---|
| A | PC/ABS | NA | NA | NA | NA | NA |
| B | CuCr2O4 | | | | | |
| C | Cu2O | 1.0 | 1.3 | 2.1 | 3.4 | 4.5 |
| D | CuO | 0.6 | 0.9 | 2.1 | 5.6 | 7.5 |
| E | CuO | 2.2 | 6.4 | 16.5 | 33.7 | 47.8 |
| F | CuO | 2.2 | 6.4 | 16.5 | 33.7 | 47.8 |
| G | Cu2O | 3.0 | 6.0 | 13.2 | 25.8 | 64.5 |
| H | Cu2O | 3.0 | 6.0 | 13.2 | 25.8 | 64.5 |
| I[i] | CuCr2O4 + Cu2O | NA | NA | NA | NA | NA |

[i]Blend of 1.5 wt. % of each component.

TABLE IB

X-ray Fluorescence Percent Compositional Data for Examples

| Example | Core/Shell/Shell | Cr$_2$O$_3$ | CuO | SiO$_2$ | Cu | Si | Al | P | Sn | Tl | S | Cl | Ni |
|---|---|---|---|---|---|---|---|---|---|---|---|---|---|
| 1 | CuCr$_2$O$_4$/SiO$_2$ | 52 | 27 | 20 | | | | | | | | | |
| 2 | CuCr$_2$O$_4$/SiO$_2$/SiO$_2$ | 46 | 24 | 29 | | | | | | | | | |
| 3 | Cu$_2$O/SiO$_2$ | | 90 | 8 | | | | | | | | | |
| 4 | Cu$_2$O/SiO$_2$ | | 89 | 10 | | | | | | | | | |
| 5 | CuO/SiO$_2$ | | 84 | 14 | | | | | | | | | |
| 6 | CuO/SiO$_2$ | | | | | | | | | | | | |
| 7 | CuO/SiO$_2$ | | | 7 | 67 | | | | | | | | |
| 8 | Cu$_2$O/SiO$_2$ | | | 6 | 75 | 2.6 | | | | | | | |
| 9 | CuO/SiO$_2$ | | | 16 | 67 | | | | | | | | |
| 10 | CuO/SiO$_2$ | | | | | | | | | | | | |
| 11 | CuO/SiO$_2$ | | | | | | | | | | | | |
| 12 | CuCr$_2$O$_4$/CuO/SiO$_2$ | 60 | 38 | 12 | | | | | | | | | |
| 13 | CuCr$_2$O$_4$/CuO/SiO$_2$ | 56 | 41 | 11 | | | | | | | | | |
| 14 | TiO$_2$/SnO$_2$ | | | | | | | 0.1 | 0.1 | 1.4 | 59 | | |
| 15 | TiO$_2$/CuO | | | | 6.4 | | | | 0.1 | | 54 | 0.6 | |
| 16 | TiO$_2$/NiO | | | | | | | 0.1 | | 51 | | 2.1 | 9.8 |
| 17 | TiO$_2$/SnO$_2$ + Sb$_2$O$_3$ | | | | | | | 0.1 | | | | | |
| 18 | CuO/SiO$_2$ | | | 14 | | | | | | | | | |
| 19 | CuO/SiO$_2$ | | | 15 | | | | | | | | | |
| 20 | CuO/SiO$_2$ | | | 16 | | | | | | | | | |
| 21 | CuO/SiO$_2$ | | | 16 | 68 | | | | | | | | |
| 22 | CuO/SiO$_2$ | | | 15 | 67 | | | | | | | | |
| 23 | Cu$_3$(PO$_4$)$_2$·Cu(OH)$_2$/Al$_2$O$_3$ | | | | 48 | | 6.8 | | | | | | |

TABLE IC

Physical Property Data for Examples (particle size distribution and specific surface area (SSA))

| Example | d10% (μm) | d50% (μm) | d90% (μm) | Mean (μm) | S.D. (μm) | SSA (g/cm$^2$) |
|---|---|---|---|---|---|---|
| 1 | 0.81 | 1.35 | 2.25 | 1.46 | 0.59 | 5.1 |
| 2 | 1.09 | 2.04 | 4.01 | 2.34 | 1.24 | 3.6 |

TABLE IC-continued

Physical Property Data for Examples (particle size distribution and specific surface area (SSA))

| Example | d10% (μm) | d50% (μm) | d90% (μm) | Mean (μm) | S.D. (μm) | SSA (g/cm²) |
|---|---|---|---|---|---|---|
| 3 | 0.79 | 1.34 | 2.25 | 1.45 | 0.60 | |
| 4 | 0.79 | 1.33 | 2.25 | 1.44 | 0.60 | |
| 5 | 0.62 | 0.95 | 3.90 | 1.08 | 0.46 | |
| 6 | 0.66 | 0.97 | 1.61 | 1.06 | 0.40 | |
| 7 | 0.73 | 1.20 | 2.19 | 1.35 | 0.63 | 7.2 |
| 8 | 0.72 | 1.16 | 2.00 | 1.28 | 0.53 | 8.8 |
| 9 | 0.74 | 1.23 | 2.23 | 1.38 | 0.63 | 8.2 |
| 10 | 0.48 | 0.73 | 1.12 | 0.78 | 0.28 | |
| 11 | 0.85 | 1.79 | 3.72 | 2.08 | 1.17 | |
| 12 | 0.72 | 1.07 | 1.66 | 1.14 | 0.38 | |
| 13 | 0.67 | 1.00 | 1.66 | 1.09 | 0.41 | |
| 14 | 0.48 | 0.75 | 1.11 | 0.78 | 0.26 | |
| 15 | 0.45 | 0.66 | 0.92 | 0.68 | 0.19 | |
| 16 | 0.43 | 0.66 | 0.96 | 0.68 | 0.23 | |
| 17 | 0.39 | 0.59 | 0.84 | 0.61 | 0.18 | |
| 18 | 0.74 | 1.40 | 3.37 | | | 7.2 |
| 19 | 0.74 | 1.41 | 3.40 | | | 31.8 |
| 20 | 0.78 | 1.48 | 3.43 | | | 7.1 |
| 21 | 0.77 | 1.41 | 3.40 | | | 7.1 |
| 22 | 0.80 | 1.51 | 3.65 | | | 7.2 |
| 23 | 0.81 | 2.19 | 5.03 | | | 9.1 |

In order to practice the invention, it is required to combine the core-shell material with a plastic or coating resin prior to thermal exposition of the resin core-shell composition in the steps of compounding, extrusion, molding, curing, drying, or similar processing applications. These systems are recognizable to those skilled in the art and typically contain additional plastic or coatings additives and filler materials that result in additional benefits during processing or subsequent processing.

The utility of the invention was demonstrated on example laboratory materials. A small quantity example material was generated and subjected to analysis and, in several cases, application testing in thermoplastic compositions was carried out. These compositions were further probed for their mechanical properties or LDS activity. For a typical embodiment of the invention, a portion comprising 0.1 to 30% of the final thermoplastic compound was blended with thermoplastic resin, and additional plastic additives. Similar additive loadings and plastic compositions are related to laser marking applications. Blends were subjected either to direct injection molding or extruded and pelletized into 3-mm×12-mm pellets prior to injection molding.

Particularly necessary to practice the invention is the core-shell material when combined, compounded, mixed, with combinations, composites, alloys, of polyether aromatic polyurethanes (TPU), aromatic polyimides (TPI), aromatic polyketones (PEK, PEEK), acrylics, aromatic polyamides (aramids), aromatic polyesters (LCP), polyarylesters (PET, PBT), polyphenylenes (PPO, PPS), acetonitrile butadiene styrene (ABS), polycarbonate (PC), polytetrafluoroethylene (PTFE) or polystyrene (PS). To the above system, the invention is combined to impart LDS activity, color, or alter other physical characteristics that aid in the processing of the plastic resin and its constituents or final characteristics of the finished article. Known within the art may be additional combinations of aromatic thermoplastics or additional plastics resins that are particularly susceptible to thermal oxidative damage that would benefit from the invention, for example, products of polyvinylchloride (PVC).

The thermoset resins most often used in the present invention include urethanes, phenolics, silicones, polyesters, polyisocyanate, polyvinylidene fluoride, epoxy resins ("epoxies"), polyimide resins ("polyimides"), bismaleimide resins (e.g., bismaleimide trizaine (BT)) and combinations thereof. The invention can be practiced in combination with coating resins including alkyds, acrylates, epoxy, urethanes, polyesters, and many hybrid systems that are compounds or mixtures of the like, for example perfluoroacrylates, or siliconized polyesters. To practice, the core-shell material is combined in the forementioned resin prior to curing, annealing, drying, or crosslinking of the material.

Physical properties of materials presented in Examples 1 to 23 are characterized in Tables IA, IB, and IC. Table IA herein are the particle size distributions measured by laser scattering of the core materials to be encapsulated to generate embodiments of the invention. Additional compositional data are provided in Table IB which includes X-ray fluorescence measurements of the post-treated material demonstrating the addition of the shell material. Finally, Table IC shows the particle size distributions of the encapsulated examples showing the utility of the methods for materials from ~0.50 μm to 2.0 μm in diameter without limitations. Indeed, embodiments of the invention as practiced have useful particle size ranging from about 0.05 μm to about 50.0 μm in diameter.

Characterization of the resulting inorganic shell over the core materials by transmission electron microscopy reveals the nature of the encapsulating materials. Shells are completely encapsulating as apparent in the micrograph of Example 21 in FIG. 1, a $SiO_2$ encapsulated CuO. Shells are also conformal to the surface of the core particles. Shells may be uniform in density, such as in Example 18 and Example 21, or may be composed of tightly bound clusters of materials, such as in Example 17 and Example 23. Key is the ability of the shell material to provide a sufficient barrier between the core and the resin as to prevent ongoing degradation of the resin during exposure to heat.

For evaluation of the improvement of mechanical properties observed by application of the invention, examples were evaluated by flexure and tensile strength measurements. Examples were extruded into a 50 wt. % PC+50 wt. % ABS blend and molded directly into tensile bars suitable for evaluation with the procedure congruent with ASTM D 638-10, and simultaneously flexural bars for testing using ASTM D 790-10, Procedure A. Tensile and Flexural testing results are shown in Table II. Copper oxides ($Cu_2O$ and CuO) are both demonstrated to negatively impact the mechanical properties of a thermoplastic resin composed of a blend of 50 wt. % PC and 50 wt. % ABS (PC/ABS). For tensile strength, $CuCr_2O_4$ containing PC/ABS blend recorded a 3% decrease over the neat PC/ABS resin. A 3% decrease is not thought in the art to be significant.

However, for samples containing $Cu_2O$ and CuO, materials known to catalyze the thermal oxidative degradation of PC and ABS, a marked reduction in tensile strength is observed. Tensile strength of Example C, a PC/ABS blend with ~2 wt. % $Cu_2O$, showed a reduction in tensile strength of 34% compared to neat PC/ABS. The thermal oxidative damage renders these samples brittle and structurally unusable. The deterioration of mechanical strength is further pronounced in the data for Example D, the CuO containing material, where a 76% reduction in tensile strength is recorded with only a 2 wt. % loading of untreated CuO.

In an example of the application of the invention, CuO and $Cu_2O$ encapsulated within a $SiO_2$ shell were prepared in PC/ABS blends and tested in identical methods as the above materials. In Table II, Example 8, a $Cu_2O$ core coated with a $SiO_2$ shell yielded only a 1% reduction in tensile strength (approximately the error of the test), a notably 34% improvement in mechanical properties of $Cu_2O$ containing materials. Example 8 was run at 6 wt. % concentration in the PC/ABS blend showing the effectiveness and robustness of the invention when applied to even sensitive thermoplastic resins. Additional samples of $SiO_2$-encapsulated $Cu_2O$, Examples 3 and 4, prepared with 9 wt. % and 12 wt. % $SiO_2$ shell respectively, yield identical improvements in the mechanical properties. Tensile strength for Example 4 is identical to the neat PC/ABS control, showing in practice of the invention the thermal oxidative damage can be completely mitigated.

copper thickness of the tested material to the copper thickness that is built up on the reference material. For the reference material, Pocan DP 7102 is used and the plating time was set to build a copper thickness of approximately 3.5 to 5.5 μm on this reference material. The plating was performed at laser powers of 3-8 W, 60-100 kHz for the examples in Table III. The average plating index and maximum plating index are both measured. Example materials were extruded in a mixture of 50 wt. % PC and 50 wt. % ABS thermoplastic resin and injection molded into 2"×3" plaques prior to structuring.

TABLE II

Mechanical Strength Measurement of Examples.

| Example | | Tensile Strength (psi) | Elongation (%) | Modulus Youngs (ksi) | Flexure Strength (psi) | Stress at 5% strain | Flexural Modulus |
|---|---|---|---|---|---|---|---|
| A | PC/ABS Control | 7,430 | 39 | 362 | NA | 12,800 | 373 |
| B[i] | $CuCr_2O_4$ | 7,220 | 37 | 358 | NA | 13,100 | 388 |
| C[ii] | $Cu_2O$ | 4,930 | 1 | 391 | 6,450 | NA | 387 |
| D[ii] | CuO | 1,770 | 0 | 394 | 3,160 | NA | 399 |
| 8[ii] | $Cu_2O$-5.6 wt. % $SiO_2$ | 7,380 | 13 | 367 | NA | 13,200 | 400 |
| 3[iii] | $Cu_2O$-9 wt. % $SiO_2$ | 7,320 | 36 | 375 | NA | 13,000 | 388 |
| 4[iii] | $Cu_2O$-12 wt. % $SiO_2$ | 7,430 | 43 | 375 | NA | 13,000 | 390 |
| 7[iii] | CuO-9 wt. % $SiO_2$ | 7,410 | 25 | 369 | NA | 13,000 | 395 |
| 18[iv] | CuO-14 wt. % $SiO_2$ | 7,590 | 14 | 395 | NA | 13,000 | 392 |
| 19[iv] | CuO-15 wt. % $SiO_2$ | 7,530 | 12 | 385 | NA | 13,100 | 377 |
| 20[iv] | CuO-16 wt. % $SiO_2$ | 7,560 | 13 | 397 | NA | 13,100 | 378 |
| 21[iv] | CuO-16 wt. % $SiO_2$ | 7,560 | 8 | 389 | NA | 13,000 | 377 |
| 22[iv] | CuO-15 wt. % $SiO_2$ | 7,530 | 12 | 389 | NA | 13,000 | 378 |
| 23[iv] | $Cu_3(PO_4)_2 \cdot Cu(OH)_2/Al_2O_3$ | 7,460 | 15 | 387 | NA | 12,900 | 388 |

[i]Plastic test bars included 6 wt. % of test material
[ii]Plastic test bars included ~2 wt. % of test material
[iii]Plastic test bars included 1.5 wt. % $CuCr_2O_4$ and 1.5 wt. % of test material An additional embodiment of the invention is 9 wt. % $SiO_2$-coated CuO, Example 7 applied within the PC/ABS system. The thermal oxidative damage can again be completely mitigated as demonstrated in Example 7. Example 7 yields a remarkable 74% improvement in tensile strength (Table II) over the uncoated CuO measured in comparable Example D. Thus, the invention enables significant new applications of the CuO material provided it is properly prepared with an inorganic oxide shell. Comparable improvement in mechanical performance strength demonstrated in tensile strength without deterioration in flexural strength is obtain in similarly prepared $SiO_2$ encapsulated CuO, see Examples 18 to 22.

In an example application of the invention, samples containing inorganic-encapsulated LDS additives were evaluated for relative LDS activity. LDS activity is judged by the electroless plating performance after laser activation "Structuring" of the injection molded plaques using different laser power and frequency and a subsequent plating procedure in an electroless copper plating bath. Plating performance was measured according to the thickness of the copper layer that was built up in approximately 30 to 60 minutes, depending on the deposition speed of exposure of the structured sample to plating bath. The copper thickness was measured using an X-ray fluorescence measurement technique. Since the deposition speed of the copper build up is highly dependent on the condition of the plating bath, a reference material was included that is known to give a stable copper build up performance.

The plating performance of the tested material is given by the so called Plating Index (PI), which is the ratio of the

TABLE III

LDS Activity of Examples in PC/ABS.

| Example | Core | Shell | LDS (AVG PI) | LDS (MAX PI) |
|---|---|---|---|---|
| 3[i] | $Cu_2O$ | 9 wt. % $SiO_2$ | 0.50 | 0.78 |
| 4[i] | $Cu_2O$ | 12 wt. % $SiO_2$ | 0.51 | 0.79 |
| 5[i] | CuO | 15 wt. % $SiO_2$ | 0.60 | 0.79 |
| 6[i] | CuO | 12 wt. % $SiO_2$ | 0.63 | 0.84 |
| 7[i] | CuO | 9 wt. % $SiO_2$ | 0.62 | 0.91 |
| 8[ii] | $Cu_2O$ | 5.6 wt. % $SiO_2$ | 0.54 | 0.85 |
| 9[iii] | CuO | 15 wt. % $SiO_2$ | 0.62 | 0.83 |
| 18 | CuO | 14 wt. % $SiO_2$ | 0.60 | 1.03 |
| 19 | CuO | 15 wt. % $SiO_2$ | 0.52 | 0.93 |
| 20 | CuO | 16 wt. % $SiO_2$ | 0.60 | 0.96 |
| 21 | CuO | 16 wt. % $SiO_2$ | 0.60 | 0.86 |
| 22 | CuO | 15 wt. % $SiO_2$ | 0.55 | 0.83 |
| 23 | $Cu_3(PO_4)_2 \cdot Cu(OH)_2$ | 13 wt. % $Al_2O_3$ | 0.17 | 0.72 |
| B[ii] | $CuCr_2O_4$ | | 0.55 | 0.70 |
| E[ii] | CuO | | 0.45 | 0.70 |
| F[iii] | CuO | | 0.34 | 0.68 |
| G[ii] | $Cu_2O$ | | 0.15 | 0.56 |
| H[iii] | $Cu_2O$ | | 0.10 | 0.52 |
| I[i] | $CuCr_2O_4$ + Cu2O | | 0.60 | 0.94 |

[i]LDS Additive included 1.5 wt. % $CuCr_2O_4$ and 1.5 wt. % of test material
[ii]LDS Additive at 6 wt. %
[iii]LDS Additive included ~2 wt. % $CuCr_2O_4$ and 1.5 wt. % of test material
[iv]LDS Additive at 5 wt. %

Functioning as LDS additives, $CuCr_2O_4$, more specifically Shepherd Color BK1G, is considered the standard material to compare with trial LDS additives. Table III compares the LDS activity of $CuCr_2O_4$ to LDS activity of encapsulated copper oxide and copper compounds.

Measuring LDS additive samples of 6 wt. % PC/ABS results in PI's of 0.45 and 0.15 for CuO (Example E) and Cu$_2$O (Example G) respectively, compared to a PI of 0.55 obtained for BK1G sample (Example B). An interesting benefit is observed with the combination of CuCr$_2$O$_4$ and Cu$_2$O in Example I, where ~9% increase in PI is measured over the CuCr$_2$O$_4$. The reason for the synergistic effect, also observed with CuO, is beyond the scope of the study but another embodiment of the invention includes combinations, blends, or mixtures of the core-shell invention with other LDS additives or additional embodiments of the invention. For untreated reference examples of CuO and Cu$_2$O, the average PI's are a minimally effective 0.34 and 0.10 for respective examples F and H compared to a PI of 0.55 obtained for BK1G sample.

It is not obvious that the presence of a shell consisting of an inorganic coating on the LDS additive might not interfere with the metal seed formation required to plate copper after the laser structuring. Measuring LDS activity for the example embodiments of the invention reveals that, indeed, the presence of the shell as demonstrated by PI's of Examples 3 through 9 (Table III) does not impede the determination of the LDS activity. In a few examples, significant improvement is observed in the maximum PI, notably for Example 8 where a PI of 0.54 is measured identical to the BK1G control in Example B and a three-fold improvement over the untreated Cu$_2$O in of Example G. In comparison, a two-fold improvement is measured for CuO core with a 15 wt. % SiO$_2$ shell comparing Example 9 to Example F. Acceptable LDS activity can be gained from or improved from material of marginal value by employing the invention on particular metal oxides capable of producing seeds.

When tested in combination with BK1G for Examples 6 and 7, the SiO$_2$-treated CuO a similar improvement in PI is observed. In this case, average PI's of ~0.63 exceed the average PI of CuCr$_2$O$_4$ and a corresponding improvement in the maximum PI results. This is despite a 50% reduction in total weight of LDS additive. A system composed of 1.5 wt. % SiO$_2$-encapsulated CuO and 1.5 wt. % Shepherd Color CuCr$_2$O$_4$ might offer the same or improved performance over a 6 wt. % CuCr$_2$O$_4$ formulation. This could allow for similar LDS activities to be obtained at a lower material cost and a reduced impact on the mechanical properties of the thermoplastic.

Despite increasing the SiO$_2$ content and the resulting thickness of the silica shell on a CuO core from 9 wt. % (in Table III, Example 7) to 15 wt. % in Example 5, nearly identical PI values are measured. The analogous observation can be made for examples of Cu$_2$O in Examples 3 and 4, where again an increase in SiO$_2$ shell coating did not impact the LDS activity. This unexpected result further demonstrates the utility of the invention permitting the compounding of LDS additives within previously incompatible thermoplastic, thermoset plastics, and coating resins without negatively impacting the LDS activity.

Further demonstration of the utility of the invention is that upon further refinement and optimization of the SiO2-CuO encapsulation chemistry and particle size, LDS activity comparable or in excess of the CuCr$_2$O$_4$ is measured for nearly identically prepared SiO2-CuO materials (Table III, Examples 18 to 22), a surprising result considering the encapsulation of LDS active CuO with an outer layer of amorphous SiO$_2$, a material not considered to have significant LDS activity.

An additional embodiment of the invention utilizes basic copper phosphate, a laser marking agent. Here Al$_2$O$_3$ encapsulation of basic copper phosphate, copper (II) hydroxide phosphate, Cu$_3$(PO$_4$)$_2$.Cu(OH)$_2$ is typified in Example 23 of Table II. The coated material has no detrimental effect on mechanical properties of the plastic post extrusion and injection molding. Utilizing the Al$_2$O$_3$ encapsulated Cu$_3$(PO$_4$)$_2$.Cu(OH)$_2$ as an LDS additive in Table III, Example 23 still yields admirable LDS performance with a PI of 0.72. This demonstrates that the coating, although completely encapsulating, did not prevent the LDS seed formation. A reasonable conclusion is that encapsulation by comparable metal oxides would also not hinder Cu$_3$(PO$_4$)$_2$.Cu(OH)$_2$ noted performance in laser marking applications or other benefits the material might provide. It should also be possible to apply similar surface treatment of other inorganic metal compounds used as LDS additives, pigments, plastic additives, and laser marking agents to prevent decay of mechanical properties due in the presence of incompatible thermoplastic, thermoset plastics, and coating resins without severely impacting the functional properties.

What is claimed is:

1. A method of processing a plastic article where the plastic article comprises (a) from about 60% to about 98% of a plastic resin, (b) from about 0.25% to about 16% of a core-shell composite material comprising a core made up on a material selected from one or more metal oxides, metal compounds, mixed metal oxides, and mixtures thereof, and a shell which completely encapsulates the core and is selected from B, Ti, Ni, Al, Zr, Co, Mg, Mo, Zn, Si, Sn, Br, Cr, W, Ce, Mn, Ba and mixtures thereof, and (c) from 0% to about 24% of fillers and additives; wherein the core component (b) includes a laser direct structuring (LDS) additive; and said plastic article is subjected to a laser beam, followed by an electroless metal deposition step wherein the metal deposited is conformational to the laser irradiated area.

2. The method according to claim 1 wherein the core material is selected from CuO, Cu$_2$O, CuCrO$_4$, Cu(II) hydroxide phosphate, basic copper phosphate, and mixtures thereof.

3. The method according to claim 2 wherein the shell is comprised of a silica material.

4. The method according to claim 1 wherein the metal deposited comprises a metal selected from copper, gold, nickel, silver, zinc, tin and mixtures thereof.

5. The method according to claim 4 wherein the metal deposited comprises copper.

6. The method according to claim 1 wherein the core has a mean particle size of from about 0.05 µm to about 50 µm.

7. The method according to claim 6 wherein the shell is selected from SnO$_2$, NiO, SiO$_x$ (wherein x is any integer commonly designated in the class of amorphous silicas), SiO$_2$, Zn$_2$SiO$_4$, SiO$_4$, Bi$_2$O$_3$, ZnO, WO$_3$, Cr$_2$O$_3$, ZrO$_2$, MoO$_3$, TiO$_2$, Ni$_2$SiO$_4$, and mixtures thereof.

8. The method, according to claim 7 wherein the core-shell composite includes one or more additional shells which do not have to completely encapsulate the core.

9. The method according to claim 8 wherein the core-shell composite comprises from about 0.5% to about 40% by weight of the shell, with the balance of the composite being the core.

10. The method according to claim 9 wherein, in the core-shell composite, the core material is selected from oxides selected from V, Zr, Bi, Ba, Cu, Rh, Ag, Mo, Zn, Nd, Co, Pr, La, Mg, Al, Ru, Si, Ti, Cr, Ce, In, Mn, Sr, Mo, Ni, Pd, Pt, Sn, Fe, Sb, W and Ca, and a metal compound selected from hydroxides, sulfides, phosphates, cyanates, thiocyanates, oxalates, and mixtures thereof.

* * * * *